United States Patent
Lin et al.

(10) Patent No.: US 7,660,123 B1
(45) Date of Patent: Feb. 9, 2010

(54) HEAT DISSIPATING FIN ASSEMBLY FOR CLAMPING DYNAMIC RANDOM ACCESS MEMORY TO DISSIPATE HEAT

(75) Inventors: Kuo-Len Lin, Wugu Township, Taipei County (TW); Ken Hsu, Wugu Township, Taipei County (TW); Chih-Hung Cheng, Wugu Township, Taipei County (TW)

(73) Assignees: CPUMate Inc., Taipei (TW); Golden Sun News Techniques Co., Ltd., Taipei (TW)

( * ) Notice: Subject to any disclaimer, the term of this patent is extended or adjusted under 35 U.S.C. 154(b) by 0 days.

(21) Appl. No.: 12/276,488

(22) Filed: Nov. 24, 2008

(51) Int. Cl.
*H05K 7/20* (2006.01)
*G06F 1/20* (2006.01)

(52) U.S. Cl. .............. 361/710; 361/679.54; 361/704; 361/709; 361/715; 165/80.3; 165/185; 174/16.3

(58) Field of Classification Search ........... 361/679.46, 361/679.52–679.54, 699–704, 709–710, 361/715–716, 720–721; 165/80.3, 104.33, 165/130, 185, 80.2; 174/16.3
See application file for complete search history.

(56) References Cited

U.S. PATENT DOCUMENTS

| | | | | |
|---|---|---|---|---|
| 858,258 A * | 6/1907 | Briscoe et al. | ............. | 228/171 |
| 1,569,929 A * | 1/1926 | Haselau | ............. | 165/130 |
| 1,634,252 A * | 7/1927 | Carlberg | ............. | 165/130 |
| 1,855,644 A * | 4/1932 | Mazurette | ............. | 165/130 |
| 1,927,002 A * | 9/1933 | Olson et al. | ............. | 165/130 |
| 1,954,638 A * | 4/1934 | Loeffler | ............. | 29/890.053 |
| 4,777,560 A * | 10/1988 | Herrell et al. | ............. | 361/694 |
| 5,979,925 A * | 11/1999 | Lin | ............. | 280/279 |
| 6,802,362 B2 * | 10/2004 | Wenger et al. | ............. | 165/104.33 |
| 7,079,396 B2 * | 7/2006 | Gates et al. | ............. | 361/719 |
| 2008/0264613 A1 * | 10/2008 | Chu | ............. | 165/104.33 |
| 2009/0168356 A1 * | 7/2009 | Chen et al. | ............. | 361/709 |

FOREIGN PATENT DOCUMENTS

CN 201066482 Y * 5/2008
WO WO 0213264 A1 * 2/2002

OTHER PUBLICATIONS

Cutt et al., "Clip-On Heat Sinl for Memory Single In-Line Memory Moule", IBM TEchnical Disclosure Bulletin, vol. 32, No. 32B, Feb. 1990, pp. 259-260.*

* cited by examiner

*Primary Examiner*—Jayprakash N Gandhi
*Assistant Examiner*—Robert J Hoffberg
(74) *Attorney, Agent, or Firm*—Chun-Ming Shih

(57) ABSTRACT

An exemplary heat dissipating fin assembly for clamping the DRAM to dissipate heat includes a number of heat dissipating fins arranged in a stacked fashion and a shaft. Each of the heat dissipating fins defines a pivoting hole and a slot therein. The slots of the heat dissipating fins are configured for receiving the DRAM. The shaft goes through the pivoting hole of each of the heat dissipating fins so as to string the heat dissipating fins. The heat dissipating fin assembly can enhance heat dissipating efficiency of the DRAM and reduce cost greatly.

9 Claims, 6 Drawing Sheets

HEAT DISSIPATING FIN ASSEMBLY FOR CLAMPING DYNAMIC RANDOM ACCESS MEMORY TO DISSIPATE HEAT

BACKGROUND

The present invention relates to a heat dissipating device, and particularly to a heat dissipating fin assembly for a dynamic random access memory (DRAM).

Accompanied by the development of the semiconductor technology, it is a trend that a computer is equipped with hardware having high speed and high frequency performance to enhance execution efficiency of the computer. It is well known that the higher the operation speed of the hardware is, the higher the watts of driving electricity are; the higher the temperature of the hardware will be. That is, the hardware having high speed and high frequency performance will generate higher heat while operating than the general hardware. For example, nowadays, in order to accommodate the high operation speed of a central processing unit (CPU) of the computer, the operation frequency and transmission frequency band width of the DRAM mounted on a main board of the computer develop towards high speed and high frequency. Thus, the temperature of the operating DRAM will rise and a mass of heat will be generated from the operating DRAM. If the temperature of the DRAM is too high, the operation of the DRAM will be affected, thereby causing crashes of the computer. Therefore, it is important for the high performance computer to dispose a heating dissipating device for the DRAM.

Referring to FIG. 1, a typical heat dissipating device for the DRAM is shown. The typical heat dissipating device 1a includes two heat dissipating plates 2a and a number of elastic clipping members 3a. The two heating device plates 2a are configured for contacting with two opposite surfaces of the DRAM (not shown) respectively. The elastic clipping members 3a are adapted for clipping the two heat dissipating plates 2a so that the DRAM is clamped and fixed by the two heat dissipating plates 2a. Thus, heat generated from the operating DRAM can be removed to atmosphere by the two heat dissipating plates 2a.

However, the typical heat dissipating device 1a has poor heat dissipating efficiency because heat generated from the DRAM can only be removed to atmosphere by the two heat dissipating plates 2a. In addition, the typical heat dissipating device 1a uses the elastic clipping members 3a to clip and fix the two heat dissipating plates 2a clamping the DRAM, which may have some disadvantages. Firstly, the cost of the heat dissipating device 1a is increased because of the usage of the number of elastic clipping members 3a. Secondly, the small elastic clipping members 3a are prone to be lost and disengaged from the two heat dissipating plates 2a when the heat dissipating device 1a is subjected to shock or vibration during transportation or in operation. As a result, the two heating dissipating plates 2a can not actually contact with the DRAM and heat generated from the DRAM can not be dissipated effectively.

Therefore, what is needed is a heat dissipating fin assembly for the DRAM to overcome the disadvantages of the typical heat dissipating device described above.

BRIEF SUMMARY

The present invention relates to a heat dissipating fin assembly for clamping the DRAM to dissipate heat. The heat dissipating fin assembly includes a number of heat dissipating fins arranged in a stacked fashion. The heat dissipating fin assembly clamps the DRAM to dissipate heat. Because the number of heat dissipating fins have a large dissipating area, heat dissipating efficiency of the DRAM can be enhanced greatly.

The present invention relates to a heat dissipating fin assembly for clamping the DRAM to dissipate heat. The heat dissipating fin assembly includes a number of heat dissipating fins arranged in a stacked fashion and a shaft. The shaft penetrates the stacked heat dissipating fins so as to string the heat dissipating fins. A fixing member is screwed into the shaft to fix the heat dissipating fins. Thus, it is not necessary to use elastic clipping members outside the heat dissipating fins. Therefore, the cost of heat dissipating fin assembly is reduced and the heat dissipating fin assembly can actually contact with the DRAM, thereby increasing heat dissipating reliability of the heat dissipating fin assembly.

The present invention relates to a heat dissipating fin assembly for clamping the DRAM to dissipate heat. The heat dissipating fin assembly includes a number of heat dissipating fins arranged in a stacked fashion and a shaft. Each of the heat dissipating fins defines a pivoting hole and a slot therein. The slots of the heat dissipating fins are configured for receiving a portion of the DRAM. The shaft goes through the pivoting hole of each of the heat dissipating fins so as to string the heat dissipating fins. Thus, the heat dissipating fin assembly can be assembled quickly and the cost of the heat dissipating fin assembly can be reduced.

The present invention relates to provide a heat dissipating fin assembly for clamping the DRAM to dissipate heat. The heat dissipating fin assembly includes a number of heat dissipating fins arranged in a stacked fashion and a shaft. Each of the heat dissipating fins defines a pivoting hole and a slot therein. The shaft goes through the pivoting hole of each of the heat dissipating fins so as to string the heat dissipating fins. A notch communicating with the top side of the slot is defined on each of the heat dissipating fins. The notch is configured for increasing the elasticity of the slot so that a width of the slot can be adjusted according to a width of the heat generating component, thereby improving applicability of the heat dissipating fin assembly.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
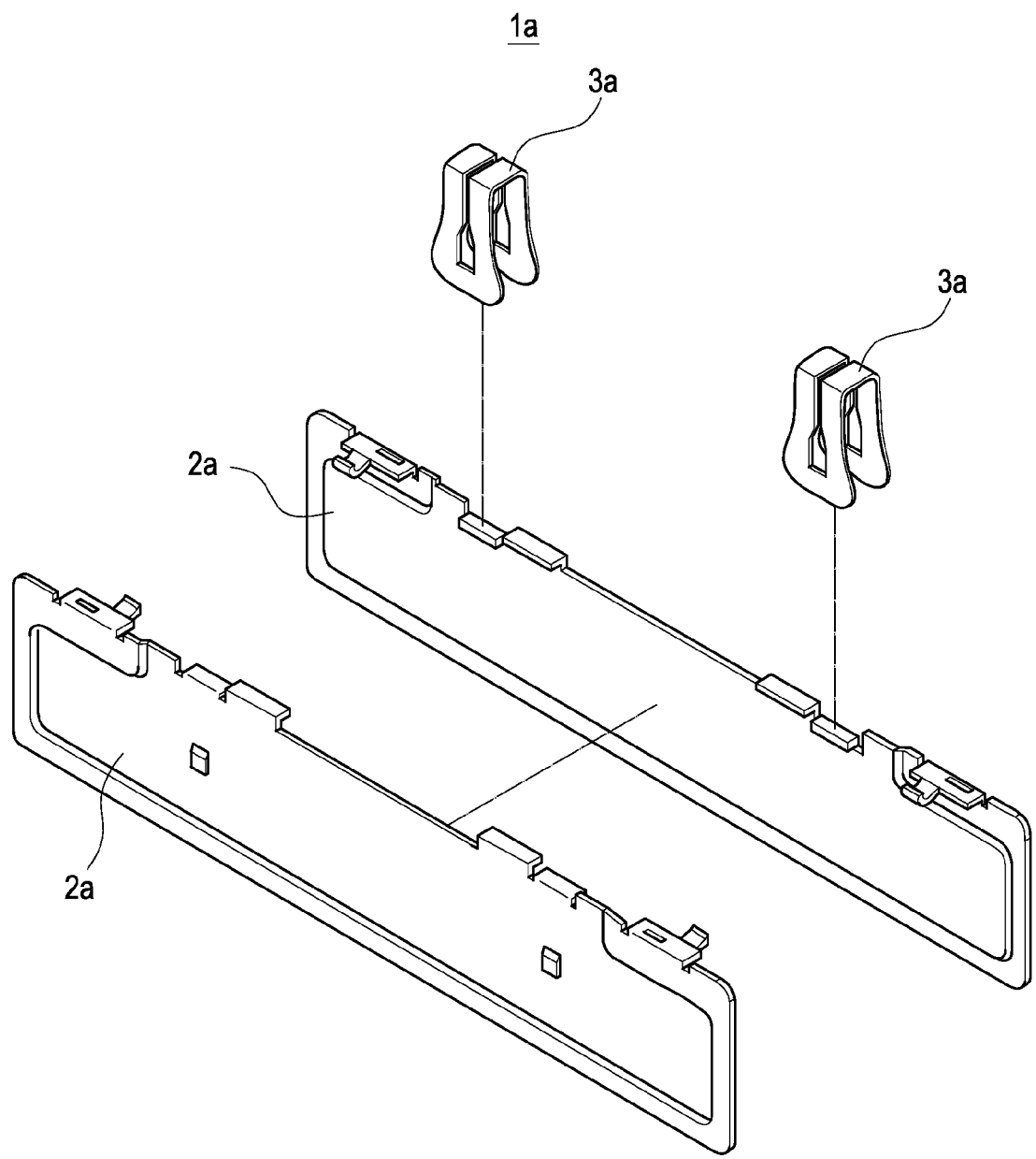
FIG. 1 is a schematic view of a typical heat dissipating device for a DRAM.
Figure 2:
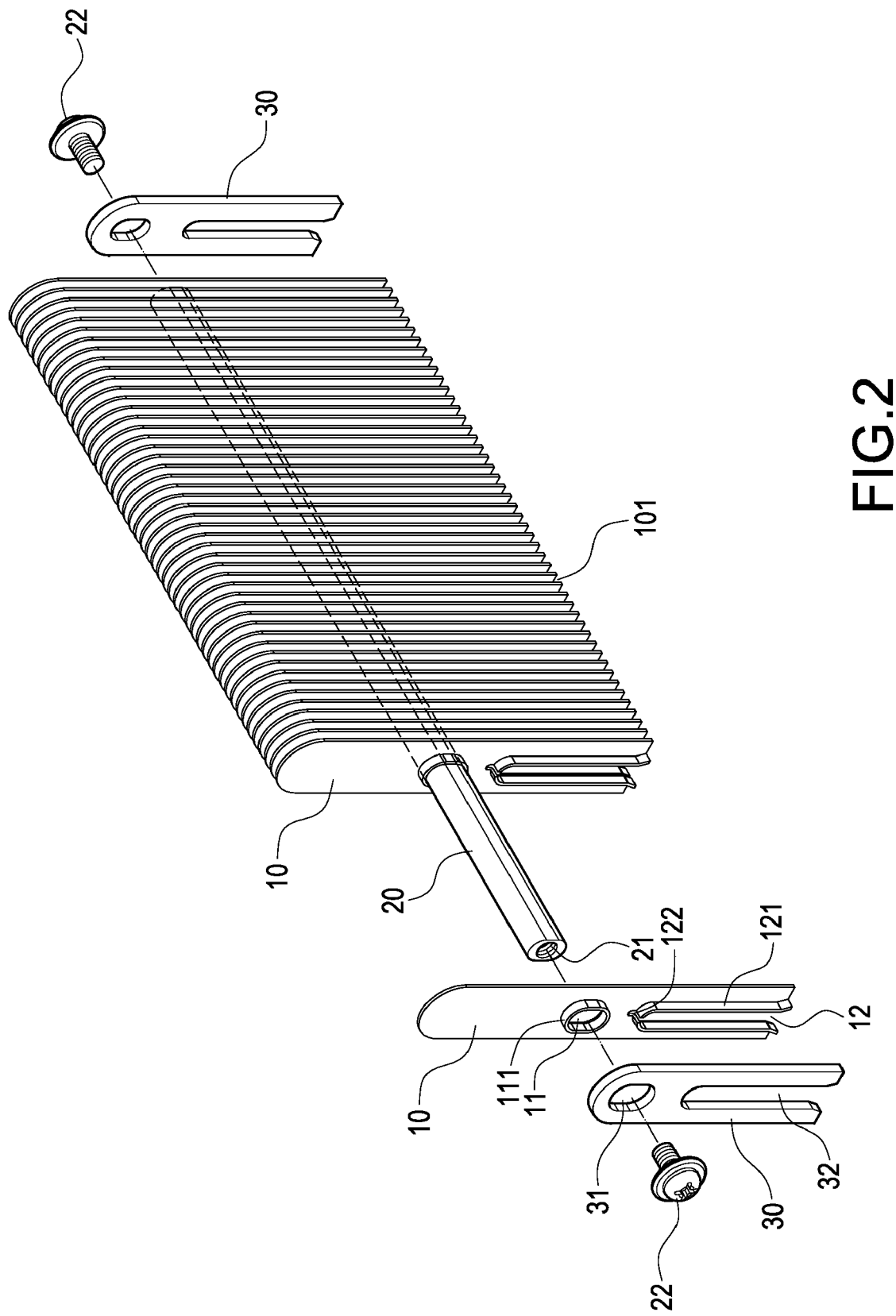
FIG. 2 is an exploded view of a heat dissipating fin assembly in accordance with the first embodiment of the present invention.

Referring to FIG. 2, an exploded view of a heat dissipating fin assembly for a DRAM in accordance with a first embodiment of the present invention is shown. The heat dissipating fin assembly is configured for clamping the DRAM to dissipate heat. The heat dissipating fin assembly includes a number of heat dissipating fins 10 and a shaft 20. The heat dissipating fins 10 are arranged in a stacked fashion. Each of the heat dissipating fins 10 defines a pivoting hole 11 and a slot 12 therein. Each of the heat dissipating fins 10 has a first flange 111 and a second flange 121 extending from a surface thereof. The first flange 111 is around the pivoting hole 11 and the second flange 121 is around the slot 12. When the heat dissipating fins 10 are arranged in a stacked fashion, the first flange 111 and the second flange 121 are configured for spacing the two adjacent heat dissipating fins 10 so as to form a heat dissipating channel 101 between the two adjacent heat dissipating fins 10. Furthermore, the second flange 121 can be capable of increasing the contacting area of the heat dissipating fins 10 and a heat generating component. In the present embodiment, the slot 12 has a configuration of half elongate ellipse. The extending direction of the slot 12 on each of the heat dissipating fins 10 is parallel to the lengthwise direction of each of the heat dissipating fins 10. One end of the slot 12 on each of the heat dissipating fins 10 communicates with the exterior of one end of each of the heat dissipating fins 10, thereby forming an opening. Thus, the heat generating component can insert into and received in the slot 12 through the opening. In fact, the configuration of the slot 12 can be designed according to the configuration of the heat generating component to be clamped. Advantageously, a notch 122 communicating with the top side of the slot 12 can be defined on each of the heat dissipating fins 10. The notch 122 is configured for increasing the elasticity of the slot 12 so that a width of the slot 12 can be adjusted according to a width of the heat generating component, thereby improving applicability of the heat dissipating fin assembly.

Additionally, two blocking plates 30 are respectively attached to two outmost sides of the heat dissipating fin assembly. That is, the two blocking plates 30 respectively contact with the two heat dissipating fins 10 on two outmost sides of the heat dissipating fin assembly. The two blocking plates 30 are cooperated and configured for blocking the heat dissipating fins 10, preventing the heat dissipating fins 10 from tilt so as to assist in fixing the heat dissipating fins 10. Each of the blocking plate 30 defines a through hole 31 corresponding to the pivoting hole 11 and a fixing slot 32 corresponding to the slot 12 therein. Thus, the blocking plates 30 can be mounted on two outmost sides of the heat dissipating fin assembly via the through hole 31 and the fixing slot 32.

The shaft 20 has a configuration of cylinder. The shaft 20 is configured for going through the pivoting hole 11 of each of heat dissipating fins 10 so as to string the heat dissipating fins 10 arranged in a stacked fashion. The shaft 20 defines a respective fixing hole 21 at two opposite ends thereof. A fixing member 22 is respectively assembled into each fixing hole 21. In the present embodiment, each of the fixing holes 22 is a screw hole, and correspondingly the fixing member 22 is a screw cap.

Figure 3:
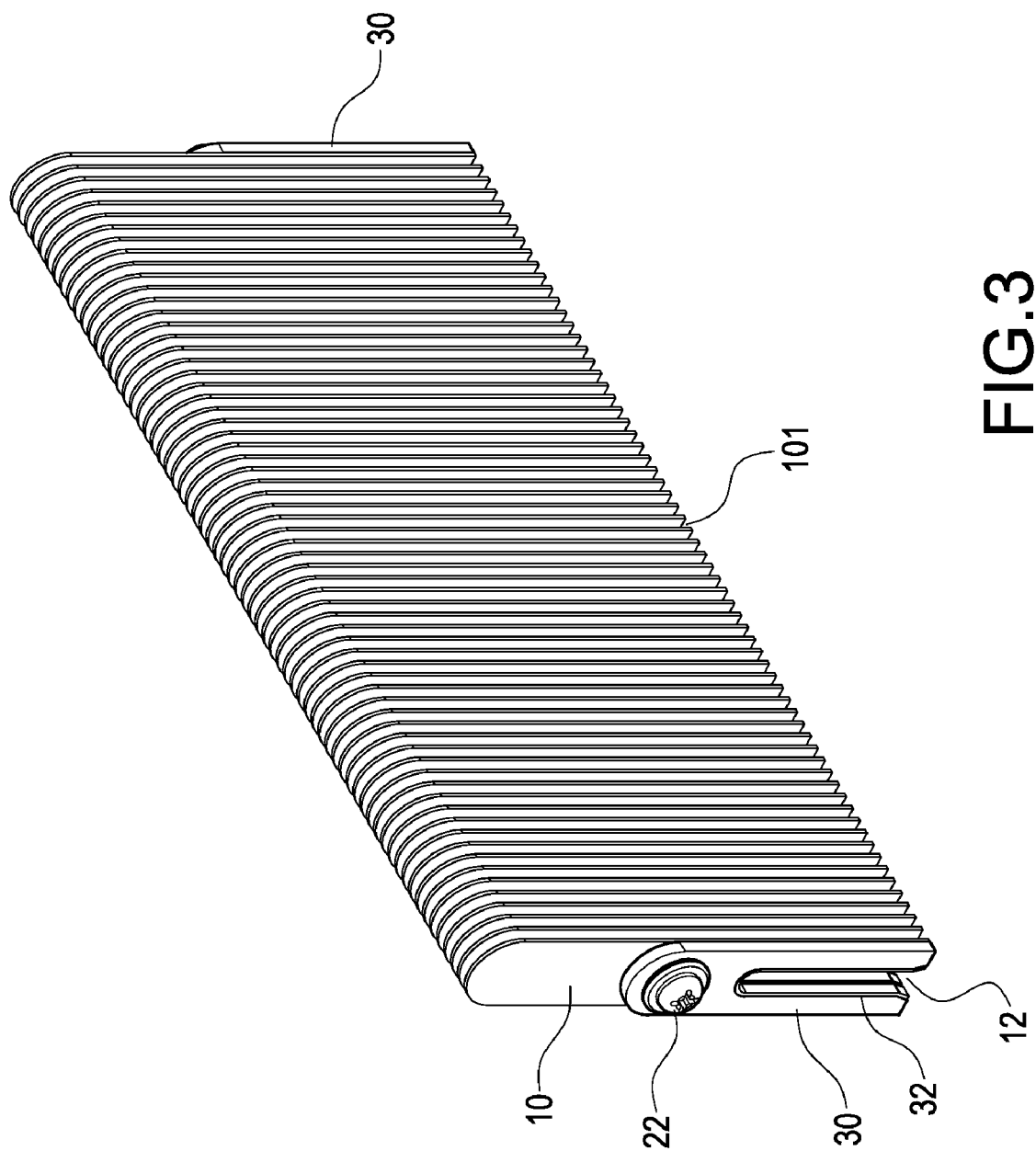
FIG. 3 is an assembly view of the heat dissipating fin assembly shown in FIG. 2.

Referring to FIG. 3, the assembly view of the heat dissipating fin assembly according to the first embodiment of the present invention is shown. The heat dissipating fins 10 are arranged regularly in a stacked fashion. The heat dissipating channel 101 are formed between the two adjacent heat dissipating fins 10. The two blocking plates 30 are respectively attached to the heat dissipating fins 10 on the two outmost sides of the heat dissipating fin assembly. The fixing member 22 (the screw cap) is screwed into the fixing hole 21 (the screw hole) of the shaft 20. As a result, the two blocking plates 30 are fixed on the heat dissipating fins 10 on the two outmost sides of the heat dissipating fin assembly. Furthermore, heat dissipating efficiency of the heat dissipating fin assembly can be enhanced by increasing the number of heat dissipating fins 10 or the area of each of the heat dissipating fins 10. Particularly, when a limited space is provided to receive the heat dissipating fin assembly and there is no more space to stack more heat dissipating fins 10, the area of each of the heat dissipating fins 10 can be increased so as to remove heat rapidly, thereby enhancing heat dissipating efficiency.

Figure 4:
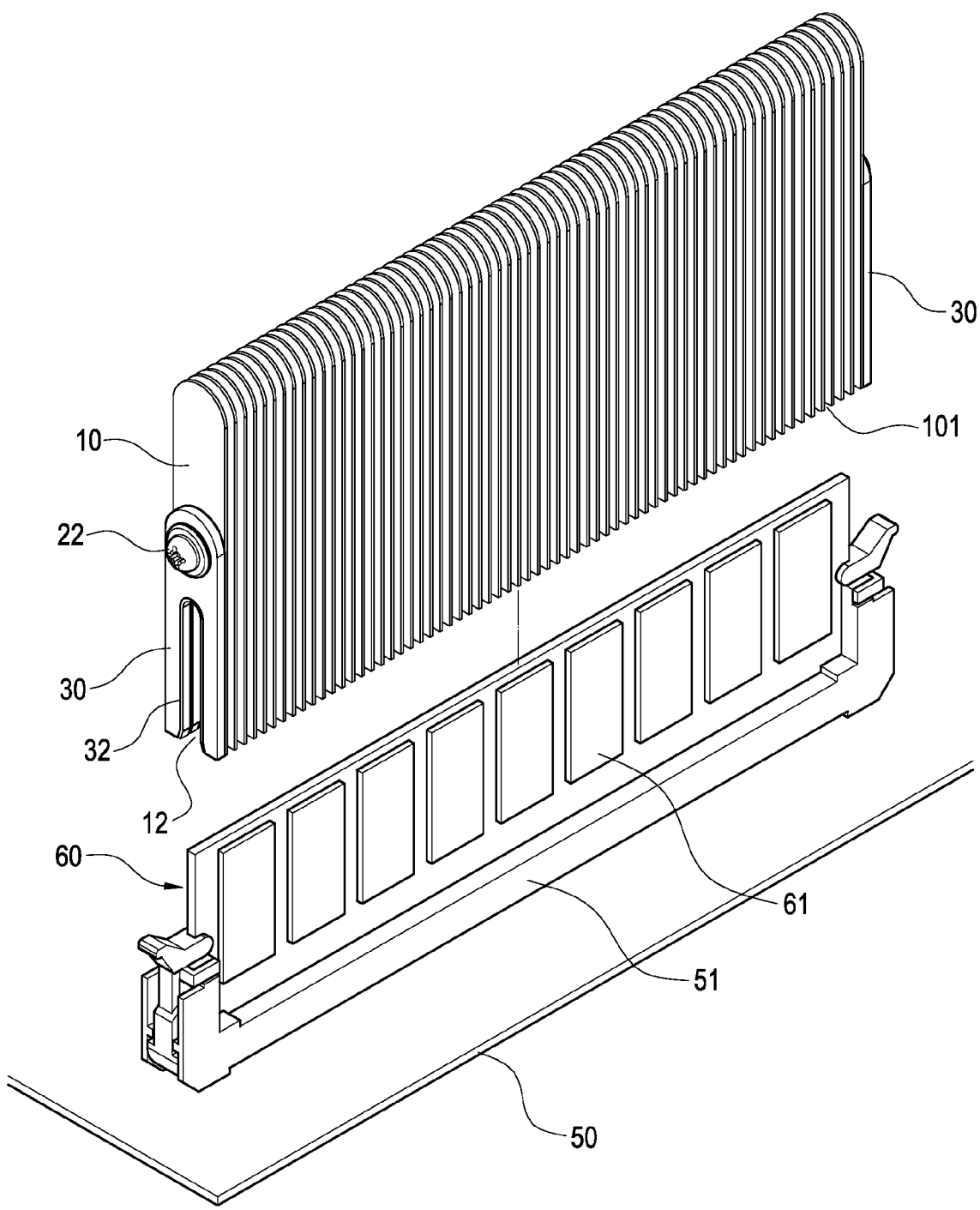
FIG. 4 is a schematic view of the heat dissipating fin assembly shown in FIG. 3, which is clamping a DRAM
Figure 5:
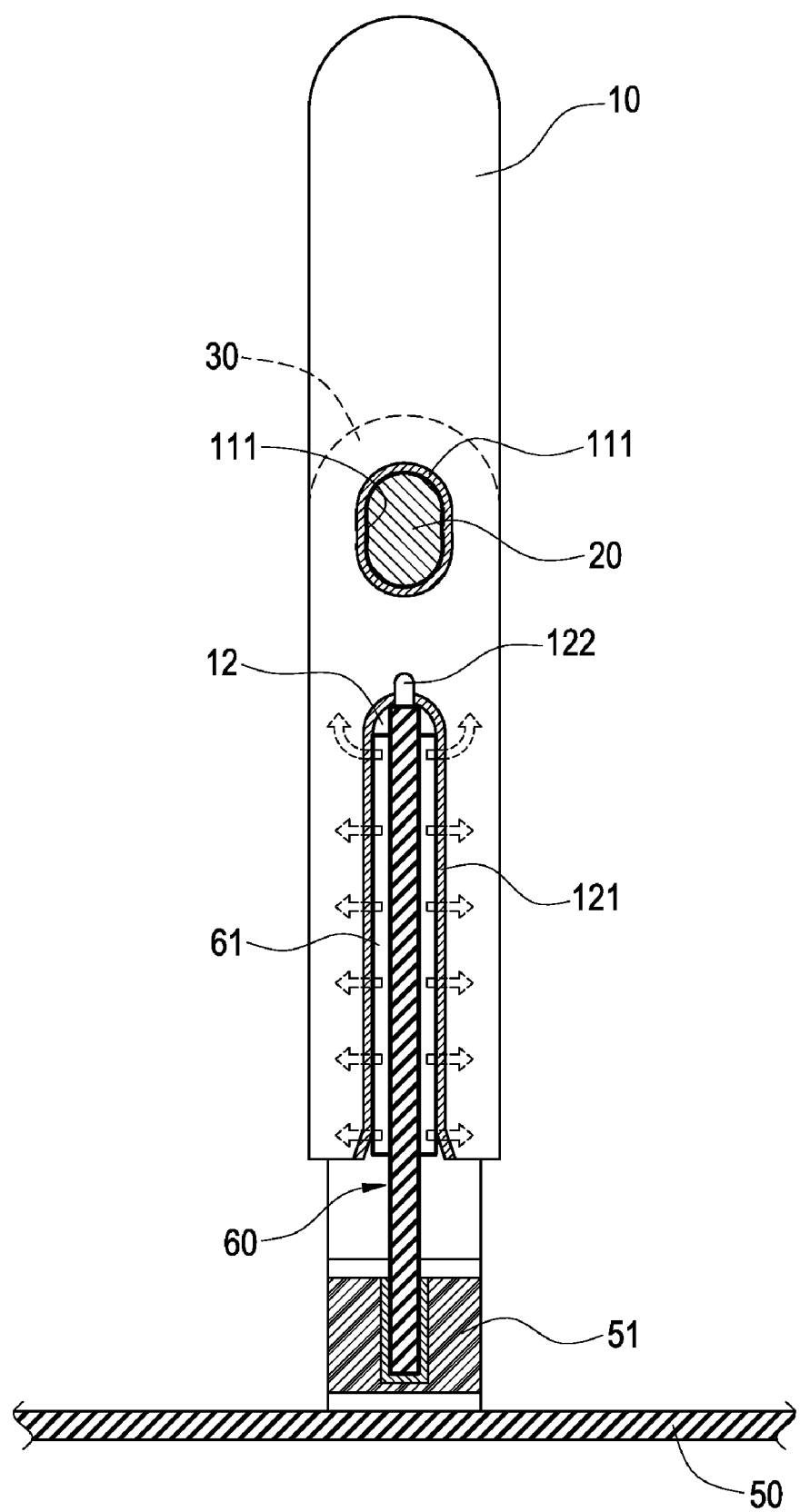
FIG. 5 is a schematic, cross-sectional view of the heat dissipating fin assembly shown in FIG. 3 clamping a DRAM.

Referring to FIG. 4, a schematic view of the heat dissipating fin assembly that is clamping a DRAM is shown. Also, referring to FIG. 5, a schematic, cross-sectional view of the heat dissipating fin assembly clamping a DRAM for heat dissipating is shown. A DRAM 60 is inserted into an inserting slot 51 of a main board 50. A heating dissipating fin assembly described above is provided and the slots 12 of the heat dissipating fin assembly face to the DRAM 60. Then, a portion of the DRAM 60 is inserted into the slots 12 so that the portion of heat dissipating fins 10 at two sides of the slots 12 contact with the DRAM chips 61 of the DRAM 60. Accordingly, heat generated from the DRAM chips 61 is transmitted from surfaces of the DRAM chips 61 to the heat dissipating fins 10, and finally the heat dissipating fins 10 dissipate the heat to atmosphere rapidly due to a large dissipating area.

Figure 6:
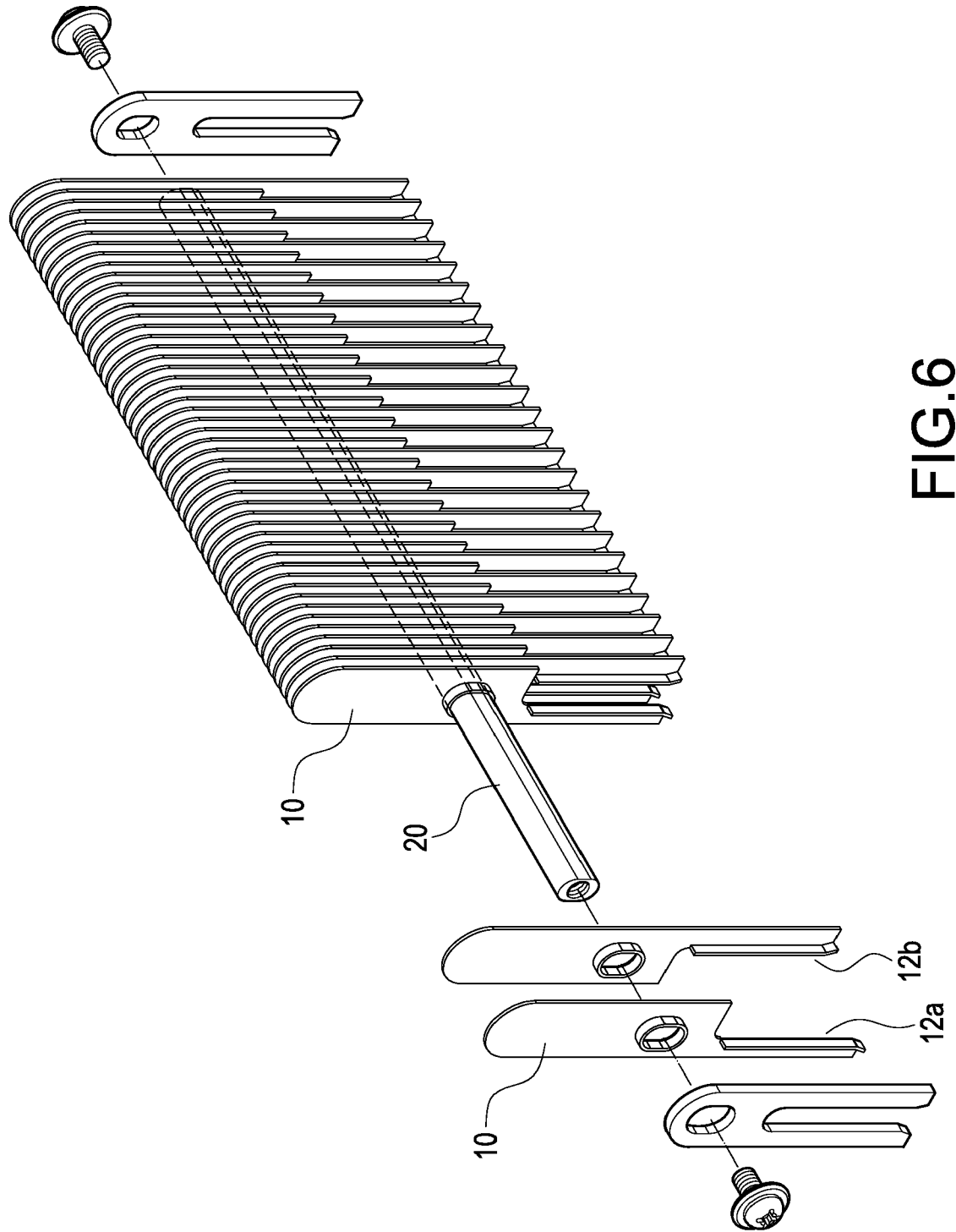
FIG. 6 is a schematic view of a heat dissipating fin assembly in accordance with the second embodiment of the present invention.

Referring to FIG. 6, a heat dissipating fin assembly for a DRAM in accordance with a second embodiment of the present invention is shown. The heat dissipating fin assembly for a DRAM in the second embodiment is similar to the heat dissipating fin assembly for a DRAM in the first embodiment except the configuration of the heat dissipating fins 10. In the second embodiment, a configuration of each of the heat dissipating fins 10 is L-shaped. Configurations of the two adjacent heat dissipating fins 10 are bilateral symmetry. That is, L-shaped configuration of one of the two adjacent heat dissipating fins 10 is symmetric to that of the other of the two adjacent heat dissipating fins 10. When the two adjacent heat dissipating fins 10 are stacked, the slots 12a, 12b of the two adjacent heat dissipating fins 10 are cooperated to form an U-shaped slot for clamping the DRAM 60.

The heat dissipating fin assembly for clamping the DRAM to dissipate heat includes a number of heat dissipating fins arranged in a stacked fashion and a shaft. Each of the heat dissipating fins defines the pivoting hole and the slot therein. The heat dissipating fin assembly clamps the DRAM via the slots of the heat dissipating fins. Because the heat dissipating fins have a large dissipating area, heat dissipating efficiency of the DRAM can be enhanced greatly. In addition, the shaft goes through the pivoting hole of each of the heat dissipating fins so as to string the heat dissipating fins arranged in a stacked fashion. The fixing member (the screw cap) is screwed into the fixing hole (the screw hole) of the shaft to fix the heat dissipating fins. Thus, it is not necessary to use elastic clipping members described in the typical heat dissipating device, thereby reducing the cost of the heat dissipating fin assembly and increasing reliability of the heat dissipating fin assembly.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A heat dissipating fin assembly for clamping a dynamic random access memory (DRAM) to dissipate heat, comprising:
   a plurality of heat dissipating fins arranged in a stacked fashion, each of the heat dissipating fins defining a pivoting hole and a slot therein, the slots of the plurality of heat dissipating fins being configured for receiving the DRAM; and
   a shaft going through the pivoting hole of each of the heat dissipating fins so as to string the plurality of heat dissipating fins,
   wherein configuration of each of the heat dissipating fins is L-shaped, and configurations of the two adjacent heat dissipating fins are bilateral symmetry.

2. The heat dissipating fin assembly as claimed in claim 1, wherein each of the heat dissipating fins has a first flange around the slot.

3. The heat dissipating fin assembly as claimed in claim 1, wherein the slot has a configuration of half elongate ellipse.

4. The heat dissipating fin assembly as claimed in claim 3, wherein each of the heat dissipating fins defines a notch communicating with the top side of the slot.

5. The heat dissipating fin assembly as claimed in claim 1, wherein each of the heat dissipating fins has a second flange around the pivoting hole.

6. The heat dissipating fin assembly as claimed in claim 1, further comprising a blocking plate is attached to the heat dissipating fin on the outmost side.

7. The heat dissipating fin assembly as claimed in claim 6, wherein the blocking plate defines a through hole corresponding to the pivoting hole and a fixing slot corresponding to the slot therein.

8. The heat dissipating fin assembly as claimed in claim 1, wherein the shaft defines a respective fixing hole at two opposite ends thereof, and a fixing member is assembled into each fixing hole.

9. The heat dissipating fin assembly as claimed in claim 8, wherein each fixing hole is a screw hole, and correspondingly the fixing member is a screw cap.

\* \* \* \* \*